United States Patent
Chidambarrao

(10) Patent No.: US 7,504,697 B2
(45) Date of Patent: *Mar. 17, 2009

(54) ROTATIONAL SHEAR STRESS FOR CHARGE CARRIER MOBILITY MODIFICATION

(75) Inventor: Dureseti Chidambarrao, Weston, CT (US)

(73) Assignee: International Business Machines, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/965,993

(22) Filed: Dec. 28, 2007

(65) Prior Publication Data

US 2008/0105953 A1 May 8, 2008

Related U.S. Application Data

(63) Continuation of application No. 11/164,179, filed on Nov. 14, 2005, now Pat. No. 7,348,638.

(51) Int. Cl.
*H01L 31/00* (2006.01)
*H01L 29/00* (2006.01)

(52) U.S. Cl. .................. 257/374; 257/510; 257/E21.56; 438/294

(58) Field of Classification Search .................. 257/374, 257/327, 344, 347, 350, 351, 368, 369, 375, 257/408, 288; 438/424, 427
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppi et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke et al. | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |

(Continued)

OTHER PUBLICATIONS

K. Ota, et al. "Novel Locally Strained Channel Technique for High Performance 55nm CMOS." International Electron Devices Meeting, 2.2.1, IEEE, Feb. 2002.

(Continued)

*Primary Examiner*—Marcos D Pizarro
*Assistant Examiner*—Bilkis Jahan
(74) *Attorney, Agent, or Firm*—Scully, Scott, Murphy & Presser, P.C.; Jospeh P. Abate, Esq.

(57) ABSTRACT

A semiconductor structure and its method of fabrication utilize a semiconductor substrate having an active region mesa surrounded by an isolation trench. A first isolation region having a first stress is located in the isolation trench. A second isolation region having a second stress different than the first stress is also located in the isolation trench. The first isolation region and the second isolation region are sized and positioned to rotationally shear stress the active region mesa.

12 Claims, 2 Drawing Sheets

U.S. PATENT DOCUMENTS

| | | | |
|---|---|---|---|
| 5,459,346 | A | 10/1995 | Asakawa et al. |
| 5,471,948 | A | 12/1995 | Burroughes et al. |
| 5,557,122 | A | 9/1996 | Shrivastava et al. |
| 5,561,302 | A | 10/1996 | Candelaria |
| 5,565,697 | A | 10/1996 | Asakawa et al. |
| 5,571,741 | A | 11/1996 | Leedy |
| 5,592,007 | A | 1/1997 | Leedy |
| 5,592,018 | A | 1/1997 | Leedy |
| 5,670,798 | A | 9/1997 | Schetzina |
| 5,679,965 | A | 10/1997 | Schetzina |
| 5,683,934 | A | 11/1997 | Candelaria |
| 5,840,593 | A | 11/1998 | Leedy |
| 5,861,651 | A | 1/1999 | Brasen et al. |
| 5,880,040 | A | 3/1999 | Sun et al. |
| 5,940,716 | A | 8/1999 | Jin et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,245,621 | B1 * | 6/2001 | Hirohama ............... 438/303 |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,461,936 | B1 | 10/2002 | von Ehrenwall |
| 6,476,462 | B2 | 11/2002 | Shimizu et al. |
| 6,483,171 | B1 | 11/2002 | Forbes et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,509,618 | B2 | 1/2003 | Jan et al. |
| 6,521,964 | B1 | 2/2003 | Jan et al. |
| 6,531,369 | B1 | 3/2003 | Ozkan et al. |
| 6,877,385 | B2 * | 4/2005 | Fang et al. ............... 73/777 |
| 2001/0009784 | A1 | 7/2001 | Ma et al. |
| 2002/0063292 | A1 | 5/2002 | Armstrong et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0032261 | A1 | 2/2003 | Yeb et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |
| 2004/0113174 | A1 | 6/2004 | Chidambarrao et al. |
| 2007/0114632 | A1 * | 5/2007 | Chidambarrao et al. ..... 257/510 |
| 2007/0132035 | A1 * | 6/2007 | Ko et al. .................. 257/374 |
| 2007/0138518 | A1 * | 6/2007 | Inoue ..................... 257/288 |

OTHER PUBLICATIONS

G. Zhang, et al. "A New Mixed Mode Reliability Degradation Mechanism in Advanced Si and SiGe Bipolar Transistors." IEEE, Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structure", Paper 6.2, pp. 140-143.

C.J. Huang, et al., "Temperature Dependence and Post-Stress Recovery of Hot Electron Degradation Effects in Bipolar Transistors.", IEEE 1991 Bipolar Circuits and Technology Meeting 7.5, pp. 170-173.

S.R. Sheng, et al., "Degradation and Recovery of SiGe HBT's Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with HIgh Output Power for Potential Application in 77 GHz Automotive Radar Systems." 2003 IEEE GaAs Digest, pp. 263-266.

H. Wurzer, et al., "Annealing of Degraded npn-Transistors-Mechanisms and Modeling." IEEE Transactions on Electron Devices, vol. 41., No. 4, Apr. 1994, pp. 533-538.

B. Doyle, et al., "Recovery of Hot-Carrier Damage in Reoxidized Nitrided Oxide MOSFETs" IEEE Electron Device Letters, vol. 13, No. 1, Jan. 1992, pp. 38-40.

H.S. Momose, et al., "Analysis of the Temperature Dependence of Hot-Carrier Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft=350/300 GHz and Gate Delay Below 3.3 ps." IEEE, 4 pages.

J.C. Bean, et al., GEx SI 1-x/Si Strained Layer Superlattice Grown by Molecular Beam Epitaxy. J. Vac. Sci. Technol. A 2(2), Apr.-Jun. 1984, pp. 436,440.

J.H. Van Der Merwe, "Regular Articles." Journal of Applied Physics, vol. 34, No. 1, Jan. 1963, pp. 117-122.

J.W. Matthews, et al., "Defects in Epitaxial Multilayers." Journal of Crystal Growth 27 (1974), pp. 118-125.

Subramanian S. Iyer, et al., "Hetrojunction Bipolar Transistors Using Si—Ge Alloys." IEEE Transactions on Electron Devices, vol. 36, No. 10, Oct. 1989, pp. 2043, 2064.

R.H.M. Van De Leur, et al., "Critical Thickness for Pseudomorphic Growth of Si/Ge Alloys and Superlattices." J. Appl. Phys. 64 (6), Sep. 15, 1988, pp. 3043-3050.

D.C. Houghton, et al., "Equilibrium Critical Thickness for SI 1-x GEx Strained Layers on (100) Di." Appl. Phys. Lett. 56 (5), Jan. 29, 1990, pp. 460-462.

Kern,Rim, et al. "Transconductance Enhancement in Deep Submicron Strained-Si n-MOSFETSs" International Electron Devices Meeting, 26, 8, 1, IEEE, Sep. 1998.

Kern, Rim, et al. "Characteristics and Device Design of Sub-100 nm Strained Si N- and PMOSFTs" 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress." International Electron Devices Meeting, 34.4.1, IEEE Sep. 1999.

F. Ootsuka, et al. "A Highly Dense, High Performance 130 nm Node CMOS Technology for Large Scale System-on-a-Chip Application." International Electron Device Meeting 23.5.1, IEEE, Apr. 2000.

* cited by examiner

ROTATIONAL SHEAR STRESS FOR CHARGE CARRIER MOBILITY MODIFICATION

CROSS-REFERENCE TO RELATED APPLICATION

This application is a continuation of application Ser. No. 11/164,179, filed Nov. 14, 2005.

FIELD OF THE INVENTION

The invention relates generally to physical stress within semiconductor structures. More particularly, the invention relates to physical stress induced charge carrier mobility modification within semiconductor structures.

DESCRIPTION OF RELATED ART

Recent advances in semiconductor device design and development have involved the introduction of applied physical stress into semiconductor device components. Applied physical stress often leads to charge carrier mobility modification. In particular, enhanced charge carrier mobility generally leads to enhanced semiconductor device performance.

There are various examples of stress induced performance enhancement within semiconductor devices. For example, Doris et al., in U.S. Pat. No. 6,717,216 teaches a silicon-on-insulator (SOI) field effect transistor (FET) having a compressive stress in an undercut area to provide increased charge carrier mobility in the device.

Other examples of compressive stress or tensile stress within various locations within semiconductor structures are alternatively known to provide charge carrier mobility modification. Typically, n-FET and p-FET devices respond differently to compressive and tensile stresses since piezoresistance coefficients will typically differ as a function of several variables, including, for example, semiconductor substrate doping and crystallographic orientation. Thus, stressed components within n-FET and p-FET devices often need to be specifically engineered and optimized.

A trend within semiconductor device design and development is for continued enhanced performance at smaller dimensions. Thus, a need will continue to exist for novel structures and methods that, in turn, provide semiconductor devices with enhanced performance. To that end, the use of physically stressed semiconductor structures is likely to continue. Desirable are alternative semiconductor structures and methods for fabrication that advantageously use physical stress for semiconductor device performance enhancement.

SUMMARY OF THE INVENTION

The present invention provides a semiconductor structure having enhanced performance, as well as a method for fabricating such a semiconductor structure. Specifically, the present invention provides a semiconductor structure and a method for fabricating the semiconductor structure in which rotational shear stress is introduced into the structure to enhance performance thereof. The introduction of the rotational shear stress applies to both the inventive structure and the inventive method.

In accordance with the invention, the semiconductor structure comprises a semiconductor substrate having an isolation trench surrounding an active region mesa. The semiconductor structure also comprises a first isolation region having a first stress located in the isolation trench. The semiconductor structure also comprises a second isolation region having a second stress, which is different than the first stress, also located in the isolation trench. The first isolation region and the second isolation region are sized and positioned to rotationally shear stress the active region mesa.

The method for fabricating the inventive semiconductor structure derives from and is correlated with the semiconductor structure itself. To that end, the inventive method first provides a semiconductor substrate having an active region mesa surrounded by an isolation trench. The method also provides for forming a first isolation region having a first stress into the isolation trench. Finally, the method also provides for forming a second isolation region having a second stress different than the first stress into the isolation trench. Within the method, the first isolation region and the second isolation region are sized and positioned to rotationally shear stress the active region mesa.

The inventive structure and inventive method also provide that the first isolation region and the second isolation region may comprise a single chemical material, such as a silicon oxide material. The method further provides a specific silicon oxidation process for forming the silicon oxide material.

By "rotationally shear stress" within the invention it is meant that an active region mesa is subjected to a rotational force that if the active region mesa was unattached to a semiconductor substrate the rotational force would rotate the active region mesa with respect to the semiconductor substrate. The rotation would be along an axis that perpendicularly penetrates an exposed surface of the active region mesa. Since the active region mesa is integral to and nominally non-separable from a semiconductor substrate, it may not freely rotate to relieve such a rotational force. Rather, the active region mesa experiences a rotational shear stress due to an unrelieved rotational force. The shear within the rotational shear stress results from differing ability of an active region mesa to deform as a result of a rotational force as a function of height intervals of the active region mesa above a semiconductor substrate.

The invention is predicated upon the observation that a piezoresistance coefficient for rotational shear stress may be particularly high for certain semiconductor substrate compositions and orientations. For example, p-silicon in a normal orientation of x=(110), y=(−110) and z=(001) has a particularly high piezoresistance coefficient of 138.1 e-11/Pa for rotational shear stress in the xy plane. Thus, for that semiconductor substrate material and crystallographic orientation, the invention provides for considerable charge carrier mobility enhancement incident to rotational shear stress. The invention is also applicable to other semiconductor substrates, but will provide differing levels of performance enhancement as measured in terms of charge carrier mobility.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The invention provides a semiconductor structure and a method for fabricating the semiconductor structure. The semiconductor structure may be fabricated with enhanced performance with respect to charge carrier mobility by using a minimum of a two component isolation region located within an isolation trench that surrounds an active region mesa within the semiconductor structure. The two component isolation region includes a first isolation region having a first stress and a second isolation region having a second stress different than the first stress. The first isolation region and the second isolation region are sized and positioned to rotationally shear stress the active region mesa. The rotational shear stress influences charge carrier mobility within the active region mesa.

Figure 1:
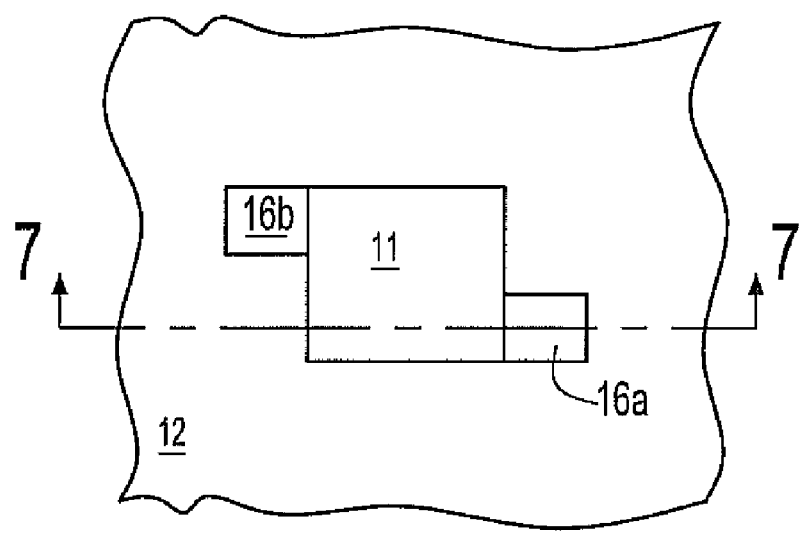
FIG. 1, FIG. 2 and FIG. 3 show a series of schematic plan-view diagrams illustrating three separate embodiments of the invention.

FIG. 1 shows a schematic plan-view diagram of a semiconductor structure in accordance with a first embodiment of the invention.

FIG. 1 shows an active region mesa 11. The active region mesa 11 is completely surrounded by a first isolation region 12. A pair of second isolation regions 16a and 16b adjoins the active region mesa 11 at a pair of opposite corners thereof. They do not completely surround the active region mesa 11 as does the first isolation region 12. Typically, the active region mesa 11 is sized in area to accommodate submicron devices, although such is not a requirement or a limitation of the invention. Typically, the pair of second isolation regions 16a and 16b is sized in area or volume to be from about 5% to about 10% the area or volume of the first isolation region 12. The invention is not so limited. Greater comparative area or volume ratios of isolation regions such as the first isolation region 12 and the pair of second isolation regions 16a and 16b are also within the context of the invention.

When the second isolation regions 16a and 16b comprise an isolation material having a compressive stress, these isolation regions impart a rotational shear stress in a clockwise direction into the active region mesa 11. The second isolation regions 16a and 16b when comprised of a material having a tensile stress impart a counter clockwise rotational shear stress into the active region mesa 11. A rotational shear stress in a clockwise direction is preferred in the first embodiment. In turn, this stress provides for enhanced hole carrier mobility when the active region mesa comprises a p silicon material of the crystallographic orientation described above. The enhanced hole carrier mobility is desirable since it, in turn, provides for enhanced performance of p channel devices such as p-FETs.

As will be illustrated in further detail below (see, e.g. FIG. 7 and FIG. 8) a channel region when located vertically centered within the active region mesa 11 as illustrated in FIG. 1 further benefits from a clockwise rotational shear stress since the clockwise rotation shear stress also imparts a longitudinal compressive stress and a transverse tensile stress into the channel region. Both of these additional stresses are also beneficial for charge carrier mobility enhancement within p-FET devices.

Figure 2:
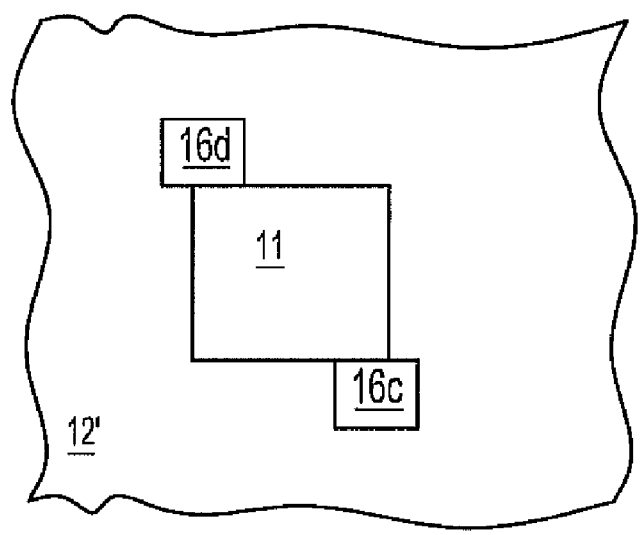

FIG. 2 shows a schematic plan-view diagram of a second embodiment of the invention. The second embodiment also shows the active region mesa 11 completely surrounded by a first isolation region 12'. The first isolation region 12' has slightly differing dimensions than the first isolation region 12 illustrated in FIG. 1. A pair of second isolation regions 16c and 16d is located contacting the active region mesa 11, but at a different location and with a different offset in comparison with the second isolation regions 16a and 16b as illustrated in FIG. 1.

In the second embodiment, the pair of second isolation regions 16c and 16d may also be comprised of a second isolation material having a tensile stress or a compressive stress. A tensile stress is preferred. This yields the preferred clockwise rotational shear stress within the active region mesa 11. Thus, an enhanced hole carrier mobility is still realized in the second embodiment when the active region mesa 11 comprises a p silicon material of the above described crystallographic orientation.

Figure 3:
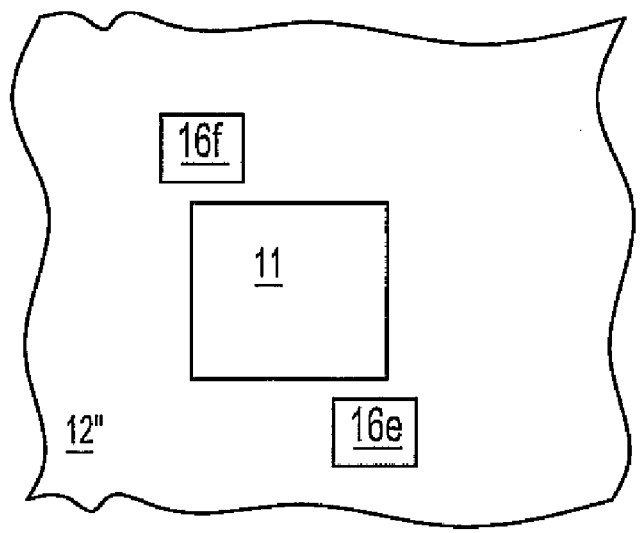

FIG. 3 shows a schematic plan-view diagram of a third embodiment of the invention. The third embodiment is similar to the second embodiment. However, the third embodiment comprises a pair of second isolation regions 16e and 16f that is separated from the active region mesa 11. Thus, within the third embodiment only one of a first isolation region 12" and the pair of second isolation regions 16e and 16f contacts the active region mesa 11. In comparison, within the first embodiment and the second embodiment both of the first isolation region 12 or 12', and the pertinent second isolation regions 16a and 16b or 16c and 16d, contact the active region mesa 11 at a sidewall thereof.

The third embodiment provides a semiconductor structure where the second isolation regions 16e and 16f do not contact the active region mesa 11. Under these circumstances, a rotational shear stress is still imparted to the active region mesa 11, but it is diminished in magnitude in comparison with the semiconductor structure of FIG. 2. The reduction results from some intervening first insulator material of different stress between the active region mesa 11 and the pair of second isolation regions 16e and 16f.

FIGS. 4-8 show a series of schematic cross-sectional diagrams illustrating the results of progressive stages in fabricating a semiconductor structure in accordance with the first embodiment of the invention. While FIGS. 4-8 are directed towards fabrication of the semiconductor structure in accordance with the first embodiment, an analogous fabrication sequence may be used for semiconductor structures in accordance with the second embodiment and the third embodiment.

The schematic cross-sectional diagrams of FIGS. 4-8 illustrate longitudinal cross-sections. A transverse cross-section is normal to the longitudinal cross-section and it also includes a cross-section through a substrate plane. A vertical direction is perpendicular to the substrate plane.

Figure 4:
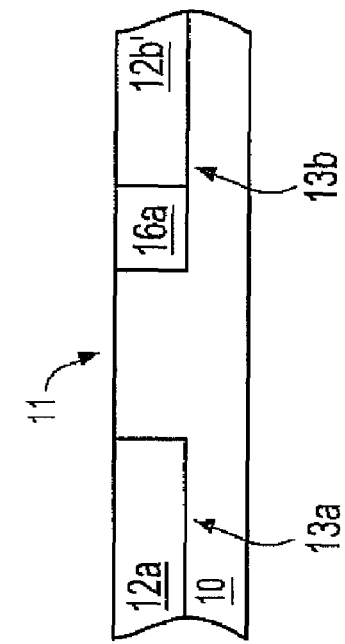
FIG. 4 to FIG. 8 show a series of schematic cross-sectional diagrams illustrating the results of progressive stages in fabricating a semiconductor structure in accordance with a first embodiment of the invention.

FIG. 4 shows a semiconductor substrate 10. It has an active region mesa 11 located therein. The active region mesa 11 separates a pair of isolation trenches 13a and 13b that adjoin the active region mesa 11. A pair of first isolation regions 12a and 12b (corresponding with the first isolation region 12 as illustrated in FIG. 1) is located in the corresponding pair of isolation trenches 13a and 13b. Each of the foregoing structures may comprise materials and have dimensions that are conventional in the semiconductor fabrication art. In addition, each of the foregoing structures may be formed using methods that are conventional in the semiconductor fabrication art.

The semiconductor substrate 10 may comprise any of several semiconductor materials, including but not limited to: silicon, germanium, silicon germanium alloy, silicon carbide, silicon germanium carbide alloy and compound (e.g., III-V and II-VI) semiconductor materials. Non-limiting examples of compound semiconductor materials include gallium arsenide, indium arsenide and indium phosphide semiconductor materials. Typically, the semiconductor substrate 10 comprises a silicon or silicon-germanium alloy semiconductor material.

Also, the semiconductor substrate 10 may comprise, but is not limited to: a bulk semiconductor substrate, a semiconductor-on-insulator substrate or a hybrid orientation technology (HOT) semiconductor substrate having multiple crystallographic orientation regions. Typically, the semiconductor substrate 10 is intended for complementary metal oxide semiconductor (CMOS) device fabrication, and it includes appropriate complementary doped semiconductor regions not otherwise illustrated in FIG. 4. Typically, the semiconductor substrate 10 has a thickness from about 0.5 to about 3 millimeters.

As noted above, the invention is preferably practiced using a p silicon semiconductor substrate having crystallographic orientation planes of x=(110), y=(−110) and z=(001). With these orientations, a piezoresistance coefficient for rotational shear stress in the xy plane of the p silicon semiconductor substrate is particularly high at 138.1 e-11/Pa for p-silicon. It is lower for rotational shear stress for other planes of the above p-silicon semiconductor substrate (66.3 e-11/Pa for xz and yz planes), and for all planes of n-silicon (−13.6 e-11/Pa for xy plane and 18 e-11/Pa for xz and yz planes). The invention is not limited to the foregoing p silicon semiconductor substrate with its particularly high piezoresistance coefficient for rotational shear stress in the xy plane. A relative advantage of the invention for particular semiconductor substrates (i.e., materials compositions, doping and crystallographic orientations) is readily determined by a person skilled in the art incident to evaluation of piezoresistance coefficients.

The pair of isolation trenches 13a and 13b is typically formed while using an appropriate masking and etching of the semiconductor substrate 10. The masked semiconductor substrate 10 is preferably etched using an anisotropic etchant that preserves a straight sidewall contour of the active region mesa 11. Such anisotropic etchants are typically plasma etchants, reactive ion etchants or ion beam etchants that include a directional component, and optionally a chemical etching component. The invention may alternatively use crystallographically specific chemical etchants and, in some circumstances, also isotropic etchants. Although isotropic etchants may yield a non-planar active region mesa 11 sidewall contour, such a sidewall contour is not necessarily detrimental within the invention. Thus, such a sidewall contour is also included within the context of the invention.

Typically, each of the isolation trenches 13a and 13b has a depth from about 500 to about 2000 angstroms within the semiconductor substrate 10. At such a depth, each of the pair of isolation trenches 13a and 13b may be regarded as a "shallow" isolation trench. The embodiment and the invention are, however, not limited to shallow isolation trenches. Rather the embodiment and the invention are also applicable to deeper isolation trenches having depths of several thousand angstroms within a semiconductor substrate.

The pair of first isolation regions 12a and 12b typically comprises isolation materials that are generally conventional in the semiconductor fabrication art. Such isolation materials will typically include, but not limited to: oxides, nitrides and oxynitrides typically of silicon, but other materials are not excluded. The embodiment and invention also contemplate laminates and composites of the foregoing materials. The pair of first isolation regions 12a and 12b may have either tensile stress, compressive stress or neutral stress. Factors that influence stress within the pair of first isolation regions 12a and 12b include, but are not limited to: deposition rate and temperature, deposited film crystallinity and deposition source material compositions.

The pair of first isolation regions 12a and 12b is typically formed using at least in part a blanket dielectric layer formation method, typically followed by a planarizing method. The blanket dielectric layer may be formed using methods including, but not limited to: thermal oxidation methods, chemical vapor deposition methods and physical vapor deposition methods. High density plasma chemical vapor deposition methods are desirable insofar as they provide generally dense dielectric layers that, in turn, are desirable for isolation purposes. Planarization may be effected using methods including, but not limited to: purely mechanical methods and chemical mechanical polish (CMP) methods. Chemical mechanical polish methods are generally preferred, but the neither the instant embodiment nor the invention is so limited.

Figure 5:
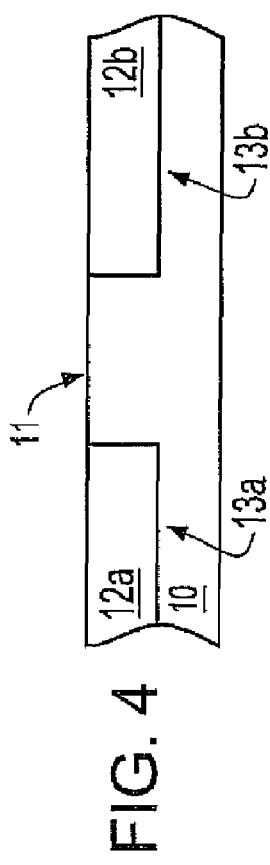

FIG. 5 shows a pair of patterned photoresist layers 14a and 14b located upon the semiconductor structure of FIG. 4. The pair of patterned photoresist layers 14a and 14b leaves exposed a portion of the active region mesa 11 and an adjoining portion of the isolation region 12b. Although not illustrated, in plan-view the pair of patterned photoresist layers 14a and 14b is intended to represent a single photoresist layer having apertures therein corresponding with locations wherein the pair of second isolation regions 16a and 16b is desired to be located. The pair of patterned photoresist layers 14a and 14b may comprise photoresist materials as are conventional in the art. Non-limiting examples of photoresist materials include: positive photoresist materials, negative photoresist materials and hybrid photoresist materials. Typically, the pair of patterned photoresist layers 14a and 14b is formed using coating, photoexposure and development methods that are similarly also conventional in the semiconductor fabrication art. Typically, each of the pair of patterned photoresist layers 14a and 14b has a thickness from about 5000 to about 15000 angstroms.

Figure 6:
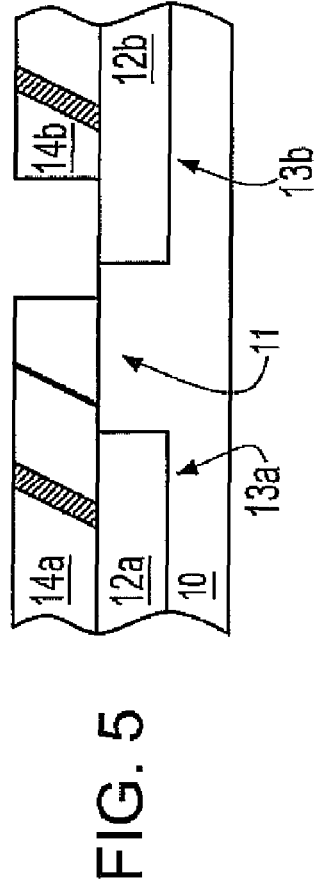

FIG. 6 shows an etched isolation region 12b' that results of etching a portion of the isolation region 12b exposed by the pair of patterned photoresist layers 14a and 14b. The etching may be accomplished using conventional dry etching techniques such as reactive-ion etching, while employing the pair of patterned photoresist layers 14a and 14b as a mask. Other etch methods such as physical etch methods and wet chemical etch methods may also advantageously be used. The etching leaves exposed sidewall portions of the active region mesa 11 and adjoining floor portions of the isolation trench 13b. Thus, a void 15 is formed.

Figure 7:
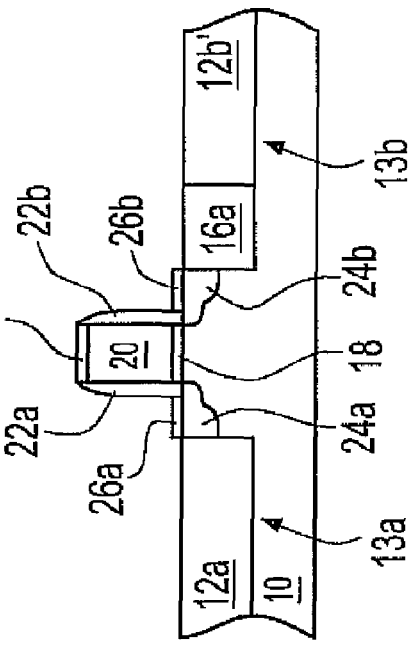

FIG. 7 first shows the results of stripping the pair of patterned photoresist layers 14a and 14b from the semiconductor structure of FIG. 6. They may be stripped using methods and materials that are conventional in the semiconductor fabrication art. Non-limiting examples include: wet chemical methods, dry plasma methods and combinations thereof.

FIG. 7 also shows a second isolation region 16a located in the void 15 as illustrated in FIG. 6. As noted above, the first embodiment provides that the first isolation regions 12a and 12b (which correspond with the first isolation region 12 illustrated in plan-view FIG. 1), comprise a first isolation material having a first stress. The second isolation region 16a comprises a second isolation material having a second stress different than the first stress. As further discussed above, the first isolation material is typically a silicon oxide material, although the invention is not so limited. The first isolation regions 12a and 12b may have either tensile stress, compressive stress or neutral stress. Most generally within the invention, an isolation region such as the second isolation region 16a may also have either tensile stress, compressive stress or neutral stress provided that the desired rotational shear stress limitations of the invention are met (incident to proper sizing and positioning of the first isolation regions 12a and 12b, and the second isolation region 16a). More typically within the first embodiment, the second isolation region 16a may have either tensile stress or compressive stress. Preferably the second isolation region 16a has compressive stress since in accordance with description corresponding with FIG. 1 the same provides for a desirable clockwise rotational shear stress in the active region mesa 11.

The second isolation region 16a may comprise dielectric materials including, but not limited to: oxide, nitride and oxynitride dielectric materials, as well as laminates thereof and composites thereof. Silicon oxide materials may be formed using a different method than used for forming the first isolation regions 12a and 12b, when they also comprise silicon oxide materials. For example, a silicon oxide material may be formed using a thermal oxidation of a deposited amorphous silicon material or polycrystalline silicon material. The oxidation is undertaken to not substantially oxidize the active region mesa 11. A silicon oxide material resulting from such a thermal oxidation may have a particularly high compressive stress since upon oxidation to yield a silicon oxide material, either an amorphous silicon material or a polysilicon material has an increase in volume. When forming the second isolation region 16a from such a silicon oxide material, a planarizing method will also typically be needed (but may not necessarily be required), since the thermally grown silicon oxide will often cover in part the active region mesa 11 and the etched first isolation region 12b'. For this reason, a planarizing stop liner layer may also optionally first be formed and located upon the semiconductor structure as illustrated in FIG. 6 absent the pair of patterned photoresist layers 14a and 14b, prior to forming the second isolation region 16a within the void 15. A nitride or oxynitride material is typically appropriate for the planarizing stop layer.

Figure 8:
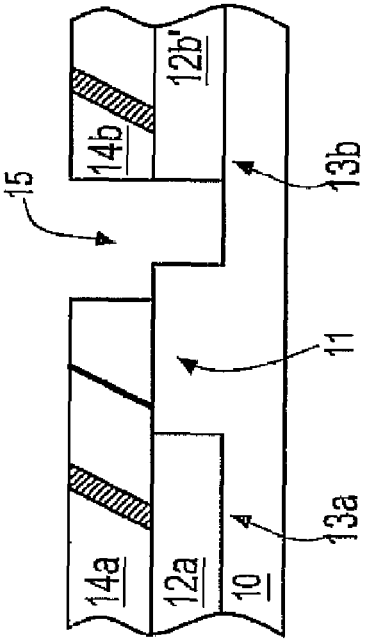

FIG. 8 shows a field effect transistor located upon the active region mesa 11. The field effect transistor comprises a gate dielectric layer 18 located upon the active region mesa 11. A gate electrode 20 is located aligned upon the gate dielectric layer 18 although such an alignment is not a limitation of the embodiment or the invention. A pair of spacer layers 22a and 22b is located adjacent and adjoining a pair of opposite sidewalls of the gate dielectric layer 18 and the gate electrode 20. A pair of source/drain regions 22a and 22b is located within the active region mesa 11 and separated by the gate electrode 20. Finally, a series of silicide layers 26a, 26b and 26c is located one each upon the pair of source/drain regions 24a and 24b, and the gate electrode 20.

Each of the foregoing structures that comprise the field effect transistor may comprise materials, and have dimensions, that are conventional in the semiconductor fabrication art. Each of the foregoing structures may also be formed using methods that are conventional in the semiconductor fabrication art.

For example, the gate dielectric layer 18 may comprise oxide, nitride or oxynitride dielectric materials that typically have a dielectric constant from about 4 to about 20, measured in vacuum. Alternatively, the gate dielectric layer 18 may comprise generally higher dielectric constant dielectric materials having a dielectric constant greater than 20, and perhaps up to about 100. These generally higher dielectric constant dielectric materials may include, but are not limited to: hafnium oxides, hafnium silicates, aluminum oxides, titanium oxides, lanthanum oxides, barium strontium titanates (BSTs) and lead zirconate titanates (PZTs). The foregoing materials may be formed using methods including, but not limited to: thermal oxidation methods, chemical vapor deposition methods, physical vapor deposition methods and atomic layer chemical vapor deposition methods. The gate dielectric layer 18 when comprising a conventional thermal silicon oxide material typically has a thickness from about 10 to about 70 angstroms.

The gate electrode 20 typically comprises a highly doped (e.g., 1e20 to 1e22 dopant atoms per cubic centimeter) polysilicon material that may be deposited employing chemical vapor deposition or physical vapor deposition methods. Alternate methods may also be used. Alternative gate electrode conductor materials may also be used. Alternative gate electrode conductor materials may include, but are not limited to: metals, metal alloys, metal nitrides and metal silicides, as well as laminates thereof and composites thereof. Typically, the gate electrode 20 has a thickness from about 500 to about 1500 angstroms.

The pair of spacers 22a and 22b generally comprise a dielectric material or a multilayer laminate of several dielectric materials. Typical but not limiting dielectric materials include oxides, nitrides and oxynitrides, typically of silicon, but other materials are not excluded. The pair of spacers 22a and 22b is typically formed utilizing a blanket layer deposition and anisotropic etch method that provides their characteristically tapered spacer shape.

The pair of source/drain regions 24a and 24b typically comprises an appropriate dopant material incorporated into the active region mesa at a concentration of up to about 1e21 dopant atoms per cubic centimeter. The dopant is selected in accordance with the type of field effect transistor desired to be fabricated within the active region mesa 11. The dopant is typically ion implanted using a two step method. The two step method uses the gate electrode 20 as a mask, both with or without the pair of spacers 22a and 22b. Thus, the pair of source/drain regions 24a and 24b has a pair of extension regions located primarily beneath the pair of spacer layers 22a and 22b.

Finally, the series of metal silicide layers 26a, 26b and 26c may comprise metal silicides of any of several metal silicide forming metals. Non-limiting examples of metal silicide forming metals include tungsten, titanium, cobalt, nickel and platinum. The metal silicide layers 26a, 26b and 26c are generally formed utilizing a blanket metal silicide forming metal layer deposition, thermal annealing and regioselective unreacted metal etch. The regioselective unreacted metal etch generally uses a wet chemical etchant specific to a particular metal silicide forming metal desired to be regioselectively removed. Alternative methods may also be used. Typically, each of the metal silicide layers 26a, 26b and 26c has a thickness from about 50 to about 200 angstroms.

FIG. 8 shows a schematic cross-sectional diagram of a field effect transistor located upon an active region mesa 11 that is rotationally shear stressed (by properly sized and positioned first isolation regions 12a and 12b corresponding with isolation region 12 in FIG. 1, and second isolation regions 16a and 16b as also illustrated in FIG. 1) in accordance with the first embodiment of the invention. The rotational shear stress provides an enhanced hole charge carrier mobility when the active region mesa comprises a particular p silicon crystallographic orientation. Thus, thus a p-FET located upon such an active region mesa has enhanced performance. In addition, rotational shear stress in a particular clockwise direction also imparts a longitudinal compressive stress and a transverse tensile stress into the channel region. Both of these additional stresses are also beneficial for charge carrier mobility enhancement within p-FET devices.

Although the instant embodiment illustrates the invention most particularly with respect to a p-FET upon an active region mesa comprising a p silicon material of particular crystallographic orientation, clearly the invention is not intended to be so limited. Rather, as noted above, a person of skill in the art can easily evaluate piezoresistance coefficients to readily determine applicability of the invention to a particular semiconductor material crystallographic orientation and doping. In addition, the invention is also clearly operative with any of several semiconductor devices that might benefit from enhanced charge carrier mobility within an active region mesa. Such devices may include, but are not limited to: field effect devices other than field effect transistors, bipolar transistors, bi-CMOS transistors, diodes and other active devices. In addition, performance enhancements are also not precluded within passive devices, including but not limited to: resistors and capacitors.

In summary, the invention provides for a modified charge carrier mobility within a semiconductor structure by imparting a rotational shear stress into an active region mesa within the semiconductor structure. The rotational shear stress is imparted by use of a two component isolation region surrounding the active region mesa. The two components include: (1) a first isolation region having a first stress; and (2) a second isolation region having a second stress different than the first stress. The first isolation region and the second isolation region are sized and positioned to rotationally shear stress the active region mesa.

The preferred embodiments illustrate the invention within the contest of a single first isolation region 12, 12' or 12" and a pair of second isolation regions 16a and 16b, 16c and 16d or 16e and 16f. However, an operative invention may be realized with at least one each of a first isolation region and a second isolation region of different stress properly sized and positioned to rotationally shear stress an active region mesa within a semiconductor structure. Multiple first isolation regions and second isolation regions may also be employed within the context of the above rotational shear stress limitations to provide an operative invention.

The preferred embodiments of the invention are illustrative of the invention rather than limiting of the invention. Revisions and modifications may be made to methods, materials, structures and dimensions in accordance with the preferred embodiments of the invention while still providing an embodiment in accordance with the invention, further in accordance with the accompanying claims.

What is claimed is:

1. A semiconductor structure comprising:
   a semiconductor substrate having an active region mesa surrounded by an isolation trench;
   at least one first isolation region having a first stress located in the isolation trench; and
   at least one second isolation region having a second stress different than the first stress also located in the isolation trench, where the first isolation region and the second isolation region are sized and positioned to rotationally shear stress the active region mesa.

2. The semiconductor structure of claim 1 wherein both the first isolation region and the second isolation region contact the active region mesa.

3. The semiconductor structure of claim 1 wherein only one of the first isolation region and the second isolation region contacts the active region mesa.

4. The semiconductor structure of claim 1 wherein the isolation trench is a shallow isolation trench.

5. The semiconductor structure of claim 1 wherein the rotational shear stress is in a clockwise direction.

6. The semiconductor structure of claim 1 wherein the rotational shear stress is in a counter clockwise direction.

7. The semiconductor structure of claim 1 further comprising a semiconductor device located upon the active region mesa.

8. The semiconductor structure of claim 7 wherein the semiconductor device is a field effect transistor.

9. A semiconductor structure comprising:
   a semiconductor substrate having an active region mesa surrounded by an isolation trench;
   at least one first isolation region having a first stress located in the isolation trench; and
   at least one second isolation region having a second stress different than the first stress also located in the isolation trench, where:
     the first isolation region and the second isolation region are sized and positioned to rotationally shear stress the active region mesa; and
     the first isolation region and the second isolation region are comprised of a same chemical composition.

10. The semiconductor structure of claim 9 wherein the first isolation region and the second isolation region comprise silicon oxide.

11. The semiconductor structure of claim 9 wherein the rotational shear stress is in a clockwise direction.

12. The semiconductor structure of claim 9 wherein the rotational shear stress is in a counter clockwise direction.

* * * * *